United States Patent [19]

Dingwall

[11] 4,196,443
[45] Apr. 1, 1980

[54] BURIED CONTACT CONFIGURATION FOR CMOS/SOS INTEGRATED CIRCUITS

[75] Inventor: Andrew G. F. Dingwall, Bridgewater, N.J.

[73] Assignee: RCA Corporation, New York, N.Y.

[21] Appl. No.: 936,779

[22] Filed: Aug. 25, 1978

[51] Int. Cl.² .................................... H01L 23/48
[52] U.S. Cl. ............................. 357/68; 357/4; 357/23; 357/65; 357/59
[58] Field of Search ............... 357/41, 23, 59, 68, 357/65, 4

[56] References Cited
U.S. PATENT DOCUMENTS 4,125,854  11/1978  McKenny .................... 357/41

Primary Examiner—Martin H. Edlow
Attorney, Agent, or Firm—Donald S. Cohen; Sanford J. Asman

[57] ABSTRACT

A configuration for manufacturing buried contacts in complementary symmetry metal oxide semiconductor (CMOS) manufactured using silicon-on-sapphire (SOS) technology is presented. The buried contact configuration is chosen to provide contact between the epitaxial silicon layer which is grown on the sapphire substrate and the polycrystalline silicon interconnects while insuring that the epitaxial silicon layer will not be removed during the etch which defines the polycrystalline silicon interconnects.

8 Claims, 6 Drawing Figures

BURIED CONTACT CONFIGURATION FOR CMOS/SOS INTEGRATED CIRCUITS

The present invention relates to an integrated circuit structure, and it is particularly related to the manufacture of CMOS/SOS integrated circuits.

The term "buried contact" means that there is a direct contact between a polycrystalline silicon interconnect or gate and the underlying regions formed in the epitaxial silicon layer.

Heretofore, buried contact technology has been employed in the integrated circuit industry in the manufacture of single channel PMOS and NMOS devices. Those devices in which buried contacts have previously been employed were manufactured in bulk silicon rather than in the silicon-on-sapphire (SOS) technology. While the use of polycrystalline silicon interconnects and buried contacts results in the elimination of space consuming metal contacts, which were previously required to connect doped semiconductor regions with the gates of MOS integrated circuits, the application of buried contacts to CMOS/SOS integrated circuits has brought major technical problems resulting from the very thin nature of the silicon epitaxial layer.

First, if the buried contact is formed so that it is larger than the contacting polycrystalline silicon, there is a possibility of overetching the polycrystalline silicon layer and then etching completely through the underlying epitaxial layer, thereby breaking the circuit path which exists. That problem did not exist when buried contacts were formed on bulk silicon wafers because bulk silicon wafers are about 15 mils thick whereas the epitaxial silicon layer formed on a sapphire substrate of SOS technology is only about 0.02 mils, i.e. 5000 Å thick. Thus, there was no possibility of etching completely through a bulk silicon wafer, but there is a high probability of etching through the thin epitaxial silicon layer in the manufacture of an SOS integrated circuit.

Another problem which exists when buried contacts are made relates to the fact that it is desirable to dope the polycrystalline silicon interconnect layer to make it conductive during the same step in which the underlying semiconductor regions are doped. That can be accomplished because ions can be implanted into a polycrystalline silicon layer and they will diffuse through the polycrystalline silicon layer into the underlying epitaxial layer, thus doping the underlying epitaxial layer. However, in such a step ions are not implanted with sufficient energy to cause them to pass through the gate oxide layer, as that would prevent the formation of channel regions in the MOS transistor. Accordingly, the opening for the buried contact cannot be made smaller than the width of the polycrystalline silicon interconnects (neglecting side diffusion) as that would prevent the underlying semiconductor region from being doped and would create a doped area only where the buried contact is present. Thus, the buried contact can neither be larger than nor smaller than the width of the polycrystalline silicon interconnects.

In order to avoid the problems heretofore described, a new geometry for the opening through which a buried contact is made has been devised which insures that reliable contact can be made between the polycrystalline silicon conductive lines and the underlying silicon epitaxial layer.

Figure 1:
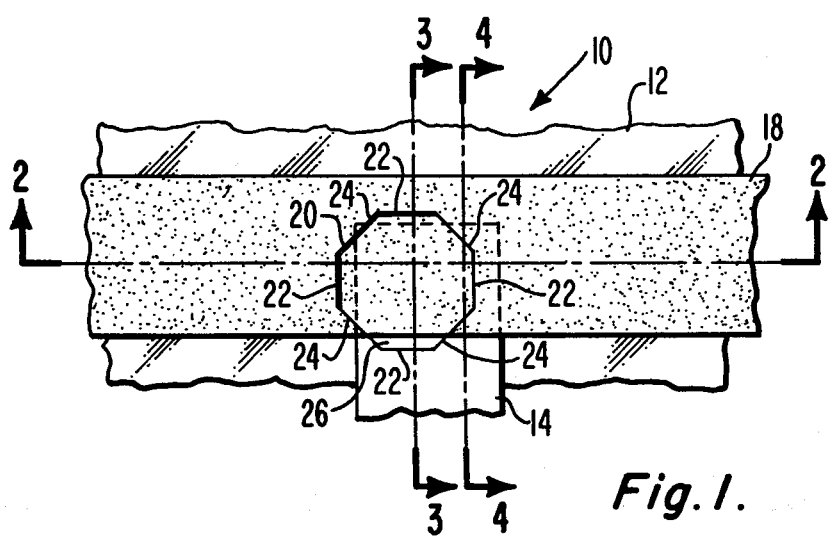
FIG. 1 is a top view of a portion of an integrated circuit including a buried contact made in accordance with the present invention.

Referring to FIG. 1, a portion of an integrated circuit 10 manufactured using SOS technology is shown. In view of the fact that the particular circuitry involved is unimportant to the present invention and is well known in the literature, the circuitry of the integrated circuit 10 is not shown. The integrated circuit 10 comprises an insulating substrate 12, such as a sapphire substrate used in the preferred embodiment of the invention. A semiconductor layer, such as epitaxial silicon layer 14, is epitaxially formed on the substrate 12 in any well known manner and is defined to provide the devices of the integrated circuit 10. Overlying the epitaxial silicon layer 14 is an insulating gate oxide layer 16 which can be seen in FIGS. 2-4. The layer 16 is etched open to form buried contact openings 20. Then, over the oxide layer 16 a polycrystalline silicon conductive layer 18 is formed, which layer 18 includes the buried contacts to the silicon layer 14. The purpose of the polycrystalline silicon layer 18 is to form conductive paths between various devices comprising the integrated circuit 10.

The opening 20 for a buried contact which was formed through the oxide layer 16 must have a geometry such that a top view is not completely comprised of lines orthogonal to or perpendicular to the defined silicon epitaxial layer 14 and the defined polycrystalline silicon interconnects 18. Thus, the opening 20 may comprise some lines 22 which are orthogonal to the defined epitaxial layer 14 and the defined polycrystalline silicon interconnects 18, but the opening 20 must also comprise lines 24 which are not orthogonal to the defined epitaxial layer 14 and the defined polycrystalline silicon interconnects 18. Thus, while an octagonal shape is shown in the preferred embodiment of the invention, other shapes, such as triangles, circles, hexangles or rhomboids may be used without departing from the inventive concept. The reason for using such a shaped contact opening 20 is to solve the problems heretofore discussed, as will be explained hereinafter.

In the manufacture of the integrated circuit 10 one starts by growing the epitaxial silicon layer 14 on the surface of the insulating substrate 12. The epitaxial silicon layer 14 is then covered by a photoresist layer which is defined using standard photolithographic techniques. The developed photoresist layer is used as an etch mask to define the epitaxial layer 14. Then, the oxide layer 16 is thermally grown on the epitaxial layer 14. The contact openings 20 are then defined and formed by a photolithography step which results in the removal of the portions of the oxide layer 16 from over the epitaxial layer 14. A polycrystalline silicon layer is deposited over the entire surface of the device and, in the preferred embodiment of the invention, is then doped in a furnace to have an N+ conductivity. The polycrystalline silicon layer is next defined into the various interconnects such as a polycrystalline silicon interconnect 18.

In the course of defining the polycrystalline silicon interconnect an etch is performed to remove unwanted portions of the polycrystalline silicon layer 14 that had been deposited over the surface of the device. Since the etchant which removes polycrystalline silicon also removes epitaxial silicon and since the epitaxial layer 14 is quite thin and is exposed beneath the polycrystalline silicon layer any place where a contact opening 20 has been formed, it is likely that there will be areas, such as areas 26, shown in FIGS. 1 and 3, where the contact opening 20 overlaps the epitaxial layer 14. Such areas 26 may be completely removed in the course of etching to define the polycrystalline silicon interconnect 18. Thus, had the opening 20 been larger than the width of the exposed epitaxial layer 14, it would have been possible to create an open circuit condition in which the etch that defined the polycrystalline silicon interconnect 18 would also have disconnected it from portions of the epitaxial layer 14. In such event the device would not operate.

Figure 2:
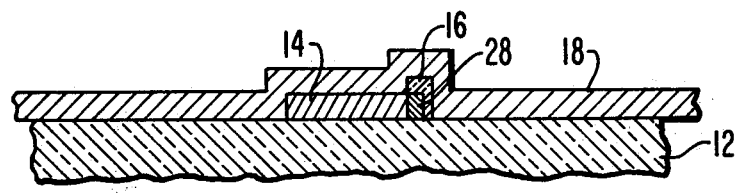
FIG. 2 is a cross-section of the portion of the integrated circuit shown in FIG. 1 taken along the lines 2—2 of FIG. 1.
Figure 3:
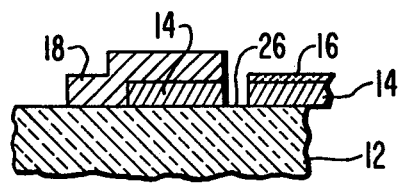
FIG. 3 is a cross-section of the portion of the integrated circuit shown in FIG. 1 taken along the line 3—3 of FIG. 1.
Figure 4:
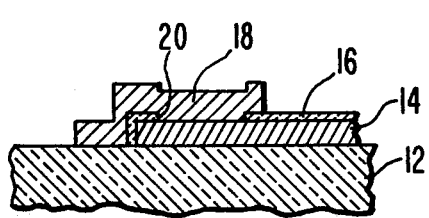
FIG. 4 is a cross-section of the portion of the integrated circuit shown in FIG. 1 taken along the line 4—4 of FIG. 1.

With reference to FIGS. 1-4, the present invention avoids the possibility of devices which do not operate as a result of alignment errors in forming the buried contacts by insuring that there cannot be any open circuit condition created by etching through the epitaxial layer 14. Accordingly, with reference to FIGS. 1, 3 and 4, there is an area 26 where the buried contact opening 20 extends over the edge of the polycrystalline silicon layer 18 into the epitaxial layer 14. Even if the portion of the epitaxial layer 14 beneath the area 26 is completely etched through, as shown in FIG. 3, there will still be portions of the epitaxial layer 14 which will be unaffected, as shown in FIG. 4.

Similarly, with reference to FIGS. 1 and 2, the present invention eliminates the problems which would otherwise be encountered as a result of the contact openings for the buried contact being smaller than the overlying epitaxial layer or not aligned if there is an alignment error. As shown in FIG. 2, a portion of the oxide layer 16 is not removed from the epitaxial layer 14 because the contact opening 20 does not extend completely over the epitaxial layer 14. As a result, the portion 28 of the epitaxial layer which underlies the remaining oxide layer 16 will not be properly doped during the ion implantation of the polycrystalline silicon layer 18 and of the portions of the epitaxial layer 14 which are not shielded by the oxide layer 16. In such event an "OFF" or only partially "ON" MOS can be formed, placing excessive resistance in the conduction path. In view of the shape of the contact opening 20 (top view), the creation of regions 28 which are not properly doped will not have a deleterious effect upon the operation of the device.

Figure 5:
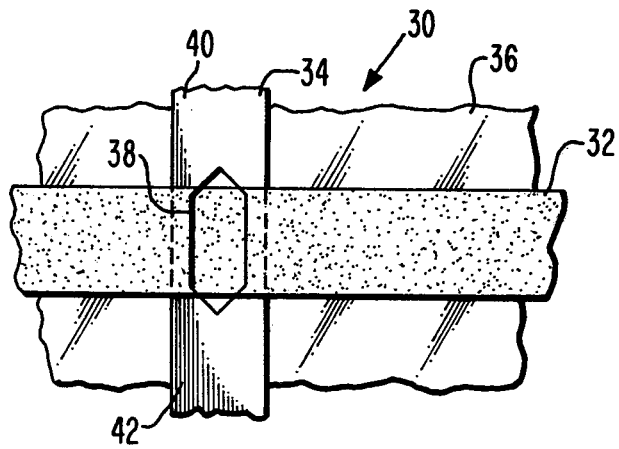
FIGS. 5 and 6 are top views of other embodiments of the invention.

Referring now to FIG. 5, another embodiment 30 of the present invention is shown. In the embodiment 30 a polycrystalline silicon line 32 (stipled) crosses an epitaxial layer 34 which is formed on an insulating substrate 36, such as a sapphire substrate. A hexangular contact opening 38 for a buried contact is narrower than the width of the epitaxial layer 34 in order to insure that the polycrystalline silicon layer 32 makes contact to the epitaxial layer 34 without creating any discontinuities between the portions 40 and 42 of the epitaxial layer 34 on either side of the polycrystalline layer 32.

Figure 6:
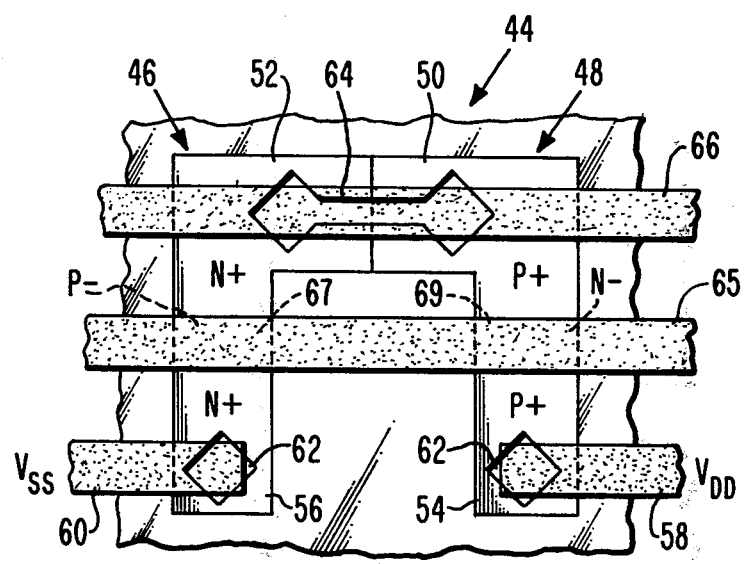

Referring to FIG. 6, another embodiment 44 of the present invention is shown. The embodiment 44 is an inverter circuit formed using an SOS technology. The embodiment 44 comprises an N-channel transistor 46 and a P-channel transistor 48. Each of the transistors 46, 48 has a drain 50, 52 and a source 54, 56. The sources 54, 56 are connected to $V_{DD}$ and $V_{SS}$, respectively, by polycrystalline lines 58, 60. Rhomboid buried contact openings 62 of the type described with reference to FIGS. 1 through 4 are used to connect the polycrystalline silicon lines 58, 60 to the source 54, 56. The drains 50, 52 of the transistors are connected by a buried contact formed through an elongated opening 64 which joins two substantially diamond shaped openings, each allowing contact to one of the drains 50, 52.

The inverter 44 is a CMOS inverter. Accordingly, when the polycrystalline silicon line 66 is doped to make it conductive, there will necessarily be a diode between the polycrystalline silicon line and one of the drains 50, 52 or, alternatively, there will be a diode formed within the polycrystalline line 66 itself. It has been found that the presence of this diode does not act to prevent the proper operation of the inverter 44. A polycrystalline silicon gate 65 overlying a P-channel region 67 of the N channel transistor 46 and an N-channel region 69 of the P channel transistor 48 acts as the input of the inverter 44.

While the shapes of the buried contact openings have been described as having at least one side which is not orthogonal to or parallel to at least one side of the conductive semiconductor interconnect which is crossed by that side of the buried contact opening, one skilled in the art can recognize that it is possible to employ arbitrarily small steps which are parallel to and orthogonal to the side of the conductive semiconductor interconnect in order to approximate the shapes referred to herein. Accordingly, the term "not orthogonal to or parallel to" is meant to include such staircase steps as would be comprised of lines orthogonal to and parallel to the side of the conductive semiconductor interconnect.

What is claimed is:

1. An integrated circuit structure of the type comprising at least one semiconductor device formed in a layer of semiconductor material which is on a substrate of insulating material, the semiconductor device including a region to which electrical contact must be made, the contact being made directly by a doped, conductive semiconductor interconnect, wherein the improvement comprises:

an opening formed in an insulating layer overlying said layer of semiconductor material through which said conductive semiconductor interconnect contacts said underlying semiconductor layer, said opening having a shape selected to have at least one edge, when viewed from the top, which is not orthogonal to or parallel to at least one edge, when viewed from the top, of said conductive semiconductor interconnect which is at least partially crossed by said edge of said opening.

2. The structure of claim 1 wherein said insulating material is sapphire.

3. The structure of claim 2 wherein the semiconductor device is formed in a layer of silicon which has been epitaxially grown on said sapphire substrate.

4. The structure of claim 3 in which said doped, conductive semiconductor interconnect is formed of polycrystalline silicon.

5. The structure of claim 4 wherein said opening has a rhomboid shape.

6. The structure of claim 4 wherein said opening has an octagonal shape.

7. The structure of claim 4 wherein said opening has a hexagonal shape.

8. The structure of claim 4 wherein said opening is adapted to interconnect at least two semiconductor regions, one of said regions having opposite conductivity type to the other one of said regions, wherein said opening extends over the junction between the two regions.

* * * * *